United States Patent
Kato et al.

(10) Patent No.: US 9,214,522 B2
(45) Date of Patent: Dec. 15, 2015

(54) PRODUCTION METHOD OF SEMICONDUCTOR DEVICE, SEMICONDUCTOR WAFER, AND SEMICONDUCTOR DEVICE

(71) Applicants: Kunihito Kato, Nisshin (JP); Toru Onishi, Nagoya (JP)

(72) Inventors: Kunihito Kato, Nisshin (JP); Toru Onishi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 30 days.

(21) Appl. No.: 14/134,325

(22) Filed: Dec. 19, 2013

(65) Prior Publication Data

US 2014/0203411 A1   Jul. 24, 2014

(30) Foreign Application Priority Data

Jan. 18, 2013   (JP) ................ 2013-007129

(51) Int. Cl.
| | |
|---|---|
| H01L 21/00 | (2006.01) |
| H01L 29/40 | (2006.01) |
| H01L 21/78 | (2006.01) |
| H01L 21/683 | (2006.01) |

(52) U.S. Cl.
CPC ............ *H01L 29/408* (2013.01); *H01L 21/78* (2013.01); *H01L 21/6836* (2013.01); *H01L 2221/6834* (2013.01); *H01L 2221/68327* (2013.01)

(58) Field of Classification Search
CPC ............... H01L 29/408; H01L 21/6836
USPC ......................................... 438/460
See application file for complete search history.

(56) References Cited

U.S. PATENT DOCUMENTS

| | | | |
|---|---|---|---|
| 2001/0035567 A1 | 11/2001 | Fujii | |
| 2007/0249118 A1 | 10/2007 | Oyu et al. | |

FOREIGN PATENT DOCUMENTS

| | | | |
|---|---|---|---|
| JP | 2001274129 A | 10/2001 | |
| JP | 2002-184777 A | 6/2002 | |
| JP | 2002-222777 A | 8/2002 | |
| JP | A-2005-26377 | 1/2005 | |
| JP | A-2005-317570 | 11/2005 | |
| JP | 2007036129 A | 2/2007 | |
| JP | 2007149974 A | 6/2007 | |
| JP | 2007288092 A | 11/2007 | |

*Primary Examiner* — Bradley K Smith
(74) *Attorney, Agent, or Firm* — Oliff PLC

(57) ABSTRACT

A semiconductor wafer, includes: a plurality of element regions; a surface electrode that is disposed in each of the plurality of element regions; an insulating layer that is disposed in each of the plurality of element regions and of which height from a front side surface of the semiconductor wafer is higher than that of the surface electrode in a periphery of the surface electrode; and a dicing line groove that is formed in a front side surface of the semiconductor wafer, that surrounds the surface electrode with the insulating layer therebetween, of which height from the front side surface of the semiconductor wafer is lower than that of the insulating layer, and that extends to a perimeter of the semiconductor wafer; in which the insulating layer is formed with a communication passage that extends from a side of the surface electrode to the dicing line groove.

6 Claims, 4 Drawing Sheets

PRODUCTION METHOD OF SEMICONDUCTOR DEVICE, SEMICONDUCTOR WAFER, AND SEMICONDUCTOR DEVICE

INCORPORATION BY REFERENCE

The disclosure of Japanese Patent Application No. 2013-007129 filed on Jan. 18, 2013 including the specification, drawings and abstract is incorporated herein by reference in its entirety.

BACKGROUND OF THE INVENTION

1. Field of the Invention

The present invention relates to a production method of a semiconductor device, a semiconductor wafer, and the semiconductor device.

2. Description of Related Art

Japanese Patent Application Publication No. 2005-317570 (JP 2005-317570 A) discloses a production method of the semiconductor device in which a protective tape is attached to a front side surface of the semiconductor wafer where an electrode and an insulating layer are formed, and a back side of the semiconductor wafer is processed in a state where the protective tape is kept attached.

A step is formed between the electrode and the insulating layer that are formed on the front side surface of the semiconductor wafer. Thus, in the technique disclosed in JP 2005-317570 A, when the protective tape is attached to the front side surface of the semiconductor wafer, a clearance may be formed between the semiconductor wafer and the protective tape at the step between the electrode and the insulating layer. In this case, air is sealed in the clearance between the semiconductor wafer and the protective tape. Then, when the back side of the semiconductor wafer is processed, if the semiconductor wafer is placed under a vacuum environment, the air sealed in the clearance may expand, and the semiconductor wafer may be damaged.

SUMMARY OF THE INVENTION

An object of the present invention is to provide the production method of the semiconductor device, the semiconductor wafer, and the semiconductor device that can inhibit the semiconductor wafer from being damaged.

A production method of a semiconductor device according to a first aspect of the present invention includes: forming, in each of a plurality of element regions disposed in a semiconductor wafer, a surface electrode and an insulating layer in a periphery of the surface electrode of which height from a front side surface of the semiconductor wafer is higher than that of the surface electrode; forming, in the front side surface of the semiconductor wafer, a dicing line groove that surrounds the surface electrode with the insulating layer therebetween, of which height from the front side surface of the semiconductor wafer is lower than that of the insulating layer, and that extends to a perimeter of the semiconductor wafer; forming, in the insulating layer, a communication groove that extends from a side of the surface electrode to a position where the dicing line groove is formed; attaching a protective tape to a front side of the semiconductor wafer in which the dicing line groove and the communication groove are formed; and processing a back side of the semiconductor wafer that is attached the protective tape.

According to the aspect of the present invention, when the insulating layer is formed, the communication groove is formed at the same time. Thus, when the protective tape is attached on the front side of the semiconductor wafer, even if the clearance is formed between the semiconductor wafer and the protective tape at the step between the surface electrode and the insulating layer, the air is hardly sealed in the clearance between the semiconductor wafer and the protective tape because the communication groove is formed on the insulating layer. Accordingly, when the back side of the semiconductor wafer is processed after that (for example, impurity implantation or ashing), even if the semiconductor wafer is placed under the vacuum environment, the air within the clearance is discharged from the perimeter of the semiconductor wafer to the outside through the communication groove and the dicing line groove. Consequently, the semiconductor wafer can be inhibited from being damaged due to the expansion of air that enters between the semiconductor wafer and the protective tape. As a result, the fabrication yield of the semiconductor device can be improved.

A semiconductor wafer according to a second aspect of the present invention includes: a plurality of element regions; a surface electrode that is disposed in each of the plurality of element regions; an insulating layer that is disposed in each of the plurality of element regions and of which height from a front side surface of the semiconductor wafer is higher than that of the surface electrode in a periphery of the surface electrode; and a dicing line groove that is formed in a front side surface of the semiconductor wafer, that surrounds the surface electrode with the insulating layer therebetween, of which height from the front side surface of the semiconductor wafer is lower than that of the insulating layer, and that extends to a perimeter of the semiconductor wafer; in which the insulating layer is formed with a communication passage that extends from a side of the surface electrode to the dicing line groove.

According to above aspect of the present invention, when the protective tape is attached on the front side of the semiconductor wafer, even if the clearance is formed between the semiconductor wafer and the protective tape, air is not sealed in the clearance. Consequently, the semiconductor wafer can be inhibited from being damaged due to the expansion of air that enters between the semiconductor wafer and the protective tape.

A semiconductor device according to a third aspect of the present invention includes: a semiconductor substrate; a surface electrode that is formed on a front side surface of the semiconductor substrate; and an insulating layer that is formed on the front side surface of the semiconductor substrate and in a periphery of the surface electrode, of which height from the front side surface of the semiconductor substrate is higher than that of the surface electrode, and that is formed with a communication passage extending from a surface electrode side of the insulating layer to a perimeter of the semiconductor substrate.

According to above aspect of the invention, the insulating layer is formed with the communication groove that extends from the side of the surface electrode to the perimeter of the semiconductor device. In the production processes of the semiconductor device, the communication groove extends to the dicing line groove that is formed on the semiconductor wafer including the plurality of the element regions. Thus, as described above, the damage of the semiconductor wafer during the production processes of the semiconductor device can be inhibited. Therefore, according to the structure described above, percent defective during the production of the semiconductor device can be reduced, and yields can be improved.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Embodiments

Figure 1:
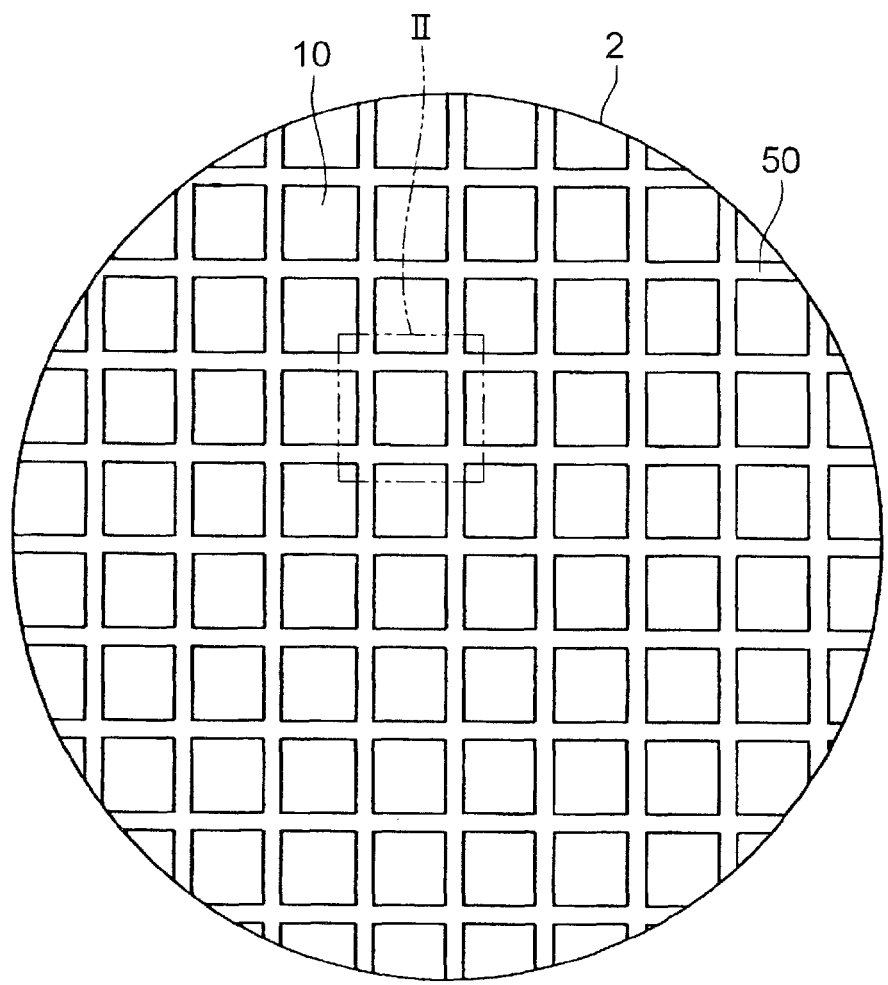
FIG. 1 is a plan view that shows a semiconductor wafer according to a first embodiment of the present invention.

A semiconductor wafer 2 according to this embodiment that is shown in FIG. 1 is a substrate mainly made of silicon (Si). The semiconductor wafer 2 according to this embodiment includes a plurality of element regions 10 and dicing line grooves 50 that surround the element regions 10 and extend to the perimeter of the semiconductor wafer 2 in a planar view.

Figure 2:
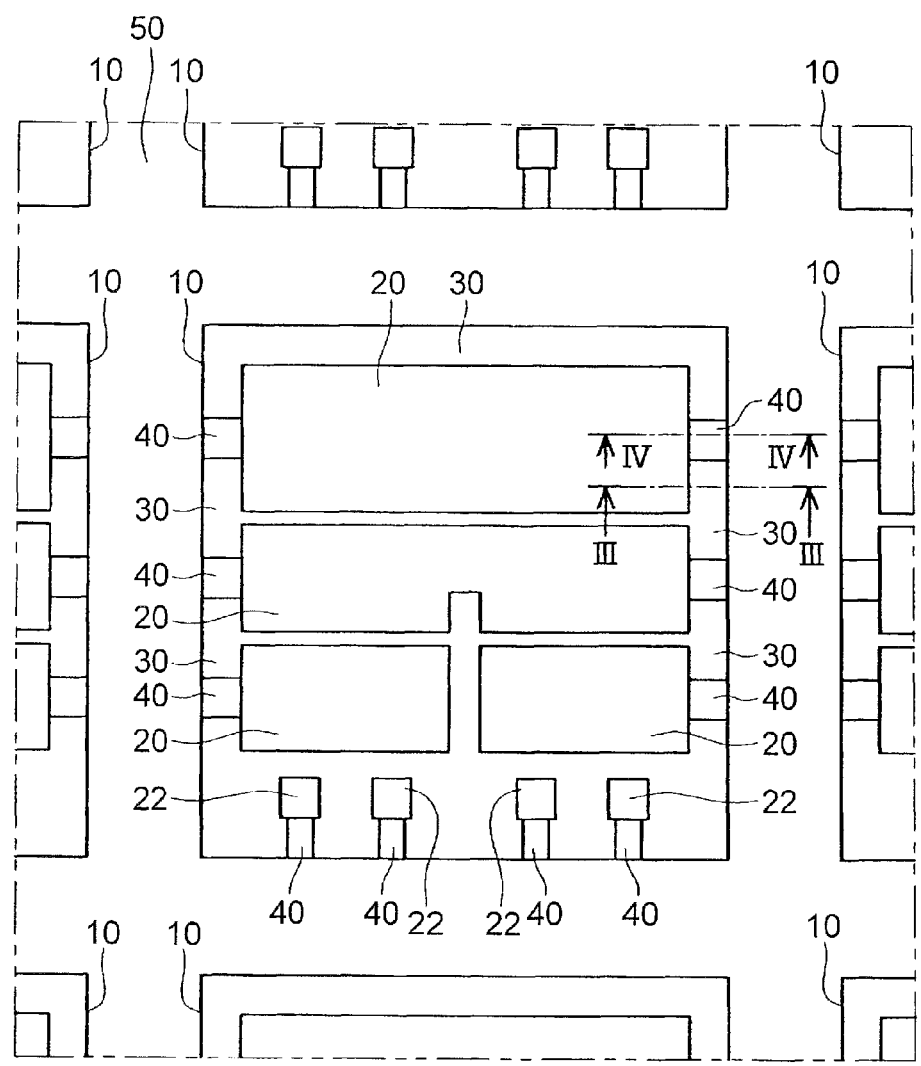
FIG. 2 is a cross-sectional view taken along the line II-II in FIG. 1.

As shown in FIG. 2, when the semiconductor wafer 2 is seen in a planar view, the element regions 10 are formed at regular intervals to each other. The element region 10 includes a plurality of surface electrodes 20, a plurality of signal pads 22, and insulating layers 30 that are formed in surroundings of the surface electrodes 20 and the signal pads 22. The insulating layers 30 are formed with communication grooves 40 that extend from the surface electrodes 20 and the signal pads 22 to the dicing line grooves 50.

Figure 3:
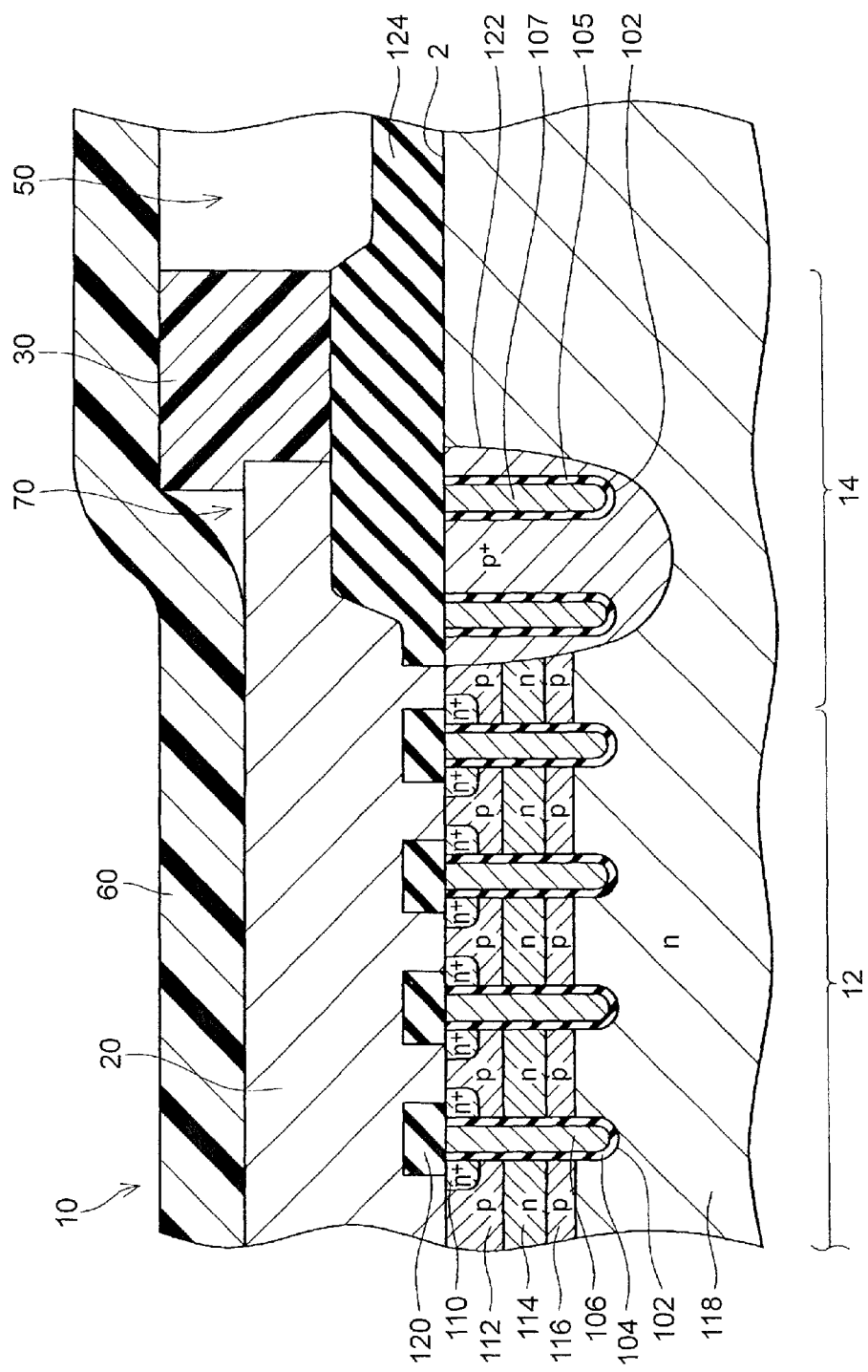
FIG. 3 is a cross-sectional view taken along the line III-III in FIG. 2.

Surface structure of the element region 10 in the semiconductor wafer 2 is described further. As shown in FIG. 3, when the semiconductor wafer 2 is seen in a section taken along the line III-III in FIG. 2, the element region 10 in the semiconductor wafer 2 is formed with a semiconductor region 12 and a termination region 14. However, the back side of the semiconductor wafer 2 according to this embodiment is unprocessed. The semiconductor region 12 can be formed with an insulated-gate bipolar transistor (IGBT) or a diode, for example, by processing (such as thinning, impurity implantation, or electrode formation) of the back side. Thus, FIG. 3 does not clearly show the back side of the semiconductor wafer 2.

The semiconductor region 12 includes a contact region 110, a top body region 112, a floating region 114, a bottom body region 116, and a drift region 118. The semiconductor region 12 also includes a plurality of trenches 102, gate insulating films 104 that cover the inner surfaces of the trenches 102, and gate electrodes 106 that are covered with the gate insulating films 104 and accommodated in the trenches 102.

The contact region 110 is an n$^+$-type region and formed in a range that is exposed to a front side surface of the semiconductor wafer 2. The top body region 112 is a p-type region and disposed to the position that is deeper than the contact region 110. The floating region 114 is an n-type region and disposed to the position that is deeper than the top body region 112. The bottom body region 116 is a p-type region and disposed to the position that is deeper than the floating region 114. The bottom body region 116 is formed in a range that is shallower than a bottom end of the trench 102. The drift region 118 is an n-type region and disposed to the position that is deeper than the bottom body region 116.

The front side surface of the contact region 110 and a part of the front side surface of the top body region 112 are ohmically connected to the surface electrode 20.

The trench 102 is formed so as to pass from the front side surface of the semiconductor wafer 2 through the contact region 110, the top body region 112, the floating region 114, and the bottom body region 116. The bottom end of the trench 102 in the depth direction protrudes from the bottom end of the bottom body region 116 to the inside of the drift region 118. As described above, the inner surface of the trench 102 is covered with the gate insulating film 104. The gate electrode 106 is accommodated in the trench 102 in a state of being covered with the gate insulating film 104. The gate electrode 106 is covered with an interlayer insulating film 120 on the upper surface and insulated from the surface electrode 20. However, at the other position that is not shown in the drawing, the gate electrode 106 is connected to the signal pad 22 (see FIG. 2).

The termination region 14 is a region that is formed in the outer periphery of the element region 10. The termination region 14 includes a separate region 122, the plurality of trenches 102, insulating films 105, and conductor regions 107.

The separate region 122 is a p-type region and formed in a range that is exposed to the front side surface of the semiconductor wafer 2. The bottom end of the separate region 122 is formed at a deeper position than the bottom end of the trench 102. The trenches 102 within the termination region 14 are formed inside the separate region 122. The upper surface of the separate region 122 and the upper surfaces of the conductor regions 107 are covered with a termination insulating film 124 and insulated from the surface electrode 20.

As shown in FIG. 3, the surface electrode 20 is formed on the front side of the semiconductor wafer 2. The surface electrode 20 is ohmically connected to the front side surface of the contact region 110 and a part of the top body region 112 that is exposed to the front side surface of the semiconductor wafer 2. The surface electrode 20 is also insulated from the gate electrodes 106 and the conductor regions 107 by the interlayer insulating films 120 and the termination insulating film 124, respectively. An outer peripheral end of the surface electrode 20 is formed to overlap with the upper surface of the termination insulating film 124.

The insulating layer 30 is formed in the perimeter of the surface electrode 20 and on the front side of the termination insulating film 124. A part of the insulating layer 30 is formed to overlap with the perimeter of the surface electrode 20. In this embodiment, the insulating layer 30 is made of polyimide. In other examples, the insulating layer 30 may be made of other resin materials that have electrical insulation properties. As shown in FIG. 3, the height of the insulating layer 30 from the front side surface of the semiconductor wafer 2 is higher than that of the surface electrode 20.

Figure 4:
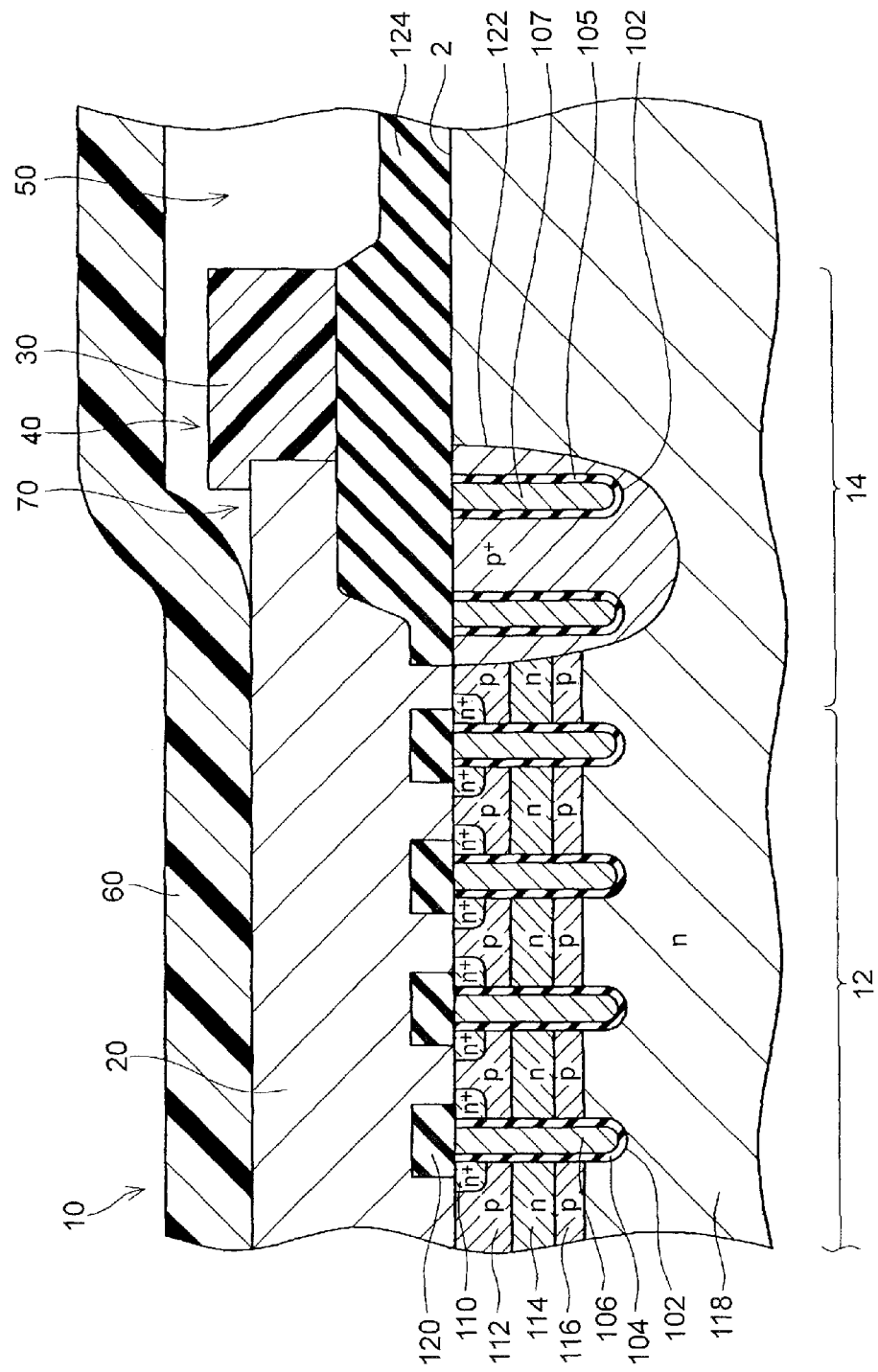
FIG. 4 is a cross-sectional view taken along the line IV-IV in FIG. 2.

As shown in FIG. 4, when the semiconductor wafer 2 is seen in a section taken along the line IV-IV in FIG. 2, the insulating layer 30 includes the communication groove 40. The communication groove 40 extends from the side of the surface electrode 20 to the dicing line groove 50. As shown in FIG. 4, the height of the insulating layer 30 at the part where the communication groove 40 is formed is lower than that of the insulating layer 30 at the part where the communication groove 40 is not formed (see FIG. 3).

As shown in FIGS. 3 and 4, the height of the dicing line groove 50 from the front side surface of the semiconductor wafer 2 is lower than that of the insulating layer 30. In addition, as shown in FIG. 2, when the semiconductor wafer 2 is seen in a planar view, the dicing line grooves 50 surround each element region 10 and extend to the perimeter of the semiconductor wafer 2.

The structure of the semiconductor wafer 2 according to this embodiment has been described so far. Next, with reference to FIGS. 3 and 4, one example is described for a protective tape 60 that is attached to the front side of the semiconductor wafer 2 so as to protect the front side surface of the semiconductor wafer 2 when the back side of the semiconductor wafer 2 according to this embodiment is processed. The protective tape 60 is a resinous tape that has an adhesive layer on the side facing the front side of the semiconductor wafer 2 (a lower side in FIGS. 3 and 4).

As shown in FIG. 3, when the protective tape 60 is attached to the front side of the semiconductor wafer 2 at the part where the communication groove 40 is not formed on the insulating layer 30, the protective tape 60 is stuck on the front side surface of the surface electrode 20 and the front side surface of the insulating layer 30. Consequently, at a step between the surface electrode 20 and the insulating layer 30, a clearance 70 is formed between the semiconductor wafer 2 and the protective tape 60.

On the other hand, as shown in FIG. 4, when the protective tape 60 is attached to the front side of the semiconductor wafer 2 at the part where the communication groove 40 is formed on the insulating layer 30, the protective tape 60 can be stuck on the front side surface of the surface electrode 20, but the protective tape 60 cannot be stuck on the front side surface of the insulating layer 30 because the communication groove 40 is formed. Thus, as shown in FIG. 4, the clearance 70 formed between the semiconductor wafer 2 and the protective tape 60 communicates with the dicing line groove 50 through the communication groove 40 at the part where the communication groove 40 is formed on the insulating layer 30. The communication groove 40 may be a passage that connects the clearance 70 to dicing line groove 50.

In other words, according to the semiconductor wafer 2 of this embodiment, when the protective tape 60 is attached on the front side of the semiconductor wafer 2, even if the clearance 70 is formed between the semiconductor wafer 2 and the protective tape 60, air is not sealed in the clearance 70. Accordingly, as described below, when the back side of the semiconductor wafer 2 is processed, even if the semiconductor wafer is placed under a vacuum environment, the air within the clearance 70 is discharged from the perimeter of the semiconductor wafer 2 to the outside through the communication groove 40 and the dicing line groove 50. Consequently, the semiconductor wafer 2 can be inhibited from being damaged due to the expansion of air that enters between the semiconductor wafer 2 and the protective tape 60.

After the back side of the semiconductor wafer 2 is processed, the semiconductor wafer 2 may be cut into dies along the dicing line grooves 50. Consequently, a plurality of semiconductor devices formed in the semiconductor wafer can be divided into pieces. According to the structure of this embodiment, the semiconductor wafer 2 can be inhibited from being damaged during the processing of the back side, and a fabrication yield of the semiconductor device can be improved.

Next, a method for producing the semiconductor wafer 2 according to this embodiment and a method for producing a plurality of semiconductor devices by using the semiconductor wafer 2 will be described. Hereinafter, one example is described for producing a reverse conducting IGBT (RC-IGBT) that include a diode region and an IGBT region.

First, the semiconductor wafer 2 in which the semiconductor region 12 and the termination region 14 (see FIG. 3) are fabricated in each of the element regions 10 is prepared.

Next, the interlayer insulating film 120 is formed on the front side surface of the semiconductor region 12 by a well-known method. Furthermore, the termination insulating film 124 is formed on the front side surface of termination region 14. The termination insulating film 124 is also formed in a part between two adjacent element regions 10 on the front side surface of the semiconductor wafer 2 (see FIG. 3). Next, the surface electrode 20 (see FIG. 3) is formed on the front side surface of the element region 10 by a well-known method.

Next, positive-type photosensitive polyimide is applied on the entire front side surface of the semiconductor wafer 2. Then, a mask is placed on the front side surface of the semiconductor wafer 2, and it is exposed to light. The mask used in the exposure is provided with openings in the part where the surface electrode 20 is formed, the part where the signal pad 22 is formed, the part where the dicing line groove 50 is formed, and the part where the communication groove 40 is formed. Here, the part where the dicing line groove 50 is formed is a part that surrounds the element region 10 and extends to the perimeter of the semiconductor wafer 2. In addition, the part where the communication groove 40 is formed is a part that extends from the side of the surface electrode 20 (signal pad 22) to the part where the dicing line groove 50 is formed. An opening area of the part where the communication groove 40 is formed is formed to be smaller than the opening area of other openings. Thus, the light exposure of the part where the communication groove 40 is formed is less than the light exposure of the part where the surface electrode 20 (signal pad 22) is formed and the light exposure of the part where the dicing line groove 50 is formed.

Next, the polyimide is removed from the exposed part by means of a developer. Accordingly, the polyimide applied on the front side surfaces of the surface electrode 20 and the signal pad 22 is removed, and the front side surfaces of the surface electrode 20 and the signal pad 22 are exposed (see FIG. 2). The polyimide in the part that surrounds the element region 10 is also removed, and the dicing line groove 50 is formed. As a result, remaining polyimide forms the insulating layer 30. The communication groove 40 is formed on the insulating layer 30 that is formed. As described above, the light exposure of the part where the communication groove 40 is formed is less than the light exposure of the part where the surface electrode 20 (signal pad 22) is formed and the light exposure of the part where the dicing line groove 50 is formed. Thus, only the polyimide in the vicinity of the front side surface is removed by means of the developer. As a result, the communication groove 40 that connects the surface electrode 20 (signal pad 22) to the dicing line groove 50 is formed on the insulating layer 30. According to the processes described above, the semiconductor wafer 2 according to this embodiment (FIG. 1 through FIG. 4) can be fabricated.

Next, as shown in FIGS. 3 and 4, the protective tape 60 is attached on the front side of the semiconductor wafer 2. In other words, in a state in which the structures such as the surface electrode 20, the insulating layer 30, and the dicing line groove 50 are formed on the front side surface of the semiconductor wafer 2, the protective tape 60 is attached over the structure. As shown in FIG. 3, at the part where the communication groove 40 is not formed on the insulating layer 30, the protective tape 60 is stuck on the front side surface of the surface electrode 20 and the front side surface of the insulating layer 30. Consequently, at a step between the surface electrode 20 and the insulating layer 30, the clearance 70 is formed between the semiconductor wafer 2 and the protective tape 60. On the other hand, as shown in FIG. 4, at the part where the communication groove 40 is formed on the insulating layer 30, the protective tape 60 can be stuck on the front side surface of the surface electrode 20, but the protective tape 60 cannot be stuck on the front side surface of the insulating layer 30. Thus, as shown in FIG. 4, the clearance 70 formed between the semiconductor wafer 2 and the protective tape 60 communicates with the dicing line groove 50 through the communication groove 40 at the part where the communication groove 40 is formed on the insulating layer 30.

Next, the back side of the semiconductor wafer 2 is ground, and the semiconductor wafer 2 is thinned. Then, impurities are implanted to the back side of the semiconductor wafer 2. More specifically, the p-type impurities are implanted to a part of the back side of the semiconductor region 12 in the semiconductor wafer 2 that is thinned, and a collector region is formed. The region of the semiconductor region 12 where the collector region is formed becomes the IGBT region. On the other hand, the n-type impurities are implanted to other parts of the back side of the semiconductor region 12 in the semiconductor wafer 2 that is thinned. The part where the n-type impurities are implanted and the drift region 118 form a cathode region. The region of the semiconductor region 12 where the cathode region is formed becomes the diode region. As a result, the RC-IGBT is formed in the element region 10.

The process for implanting the p-type impurities or n-type impurities to the back side of the semiconductor region 12 is performed under the vacuum environment. At this time, the air within the clearance 70 is discharged from the perimeter of the semiconductor wafer 2 to the outside through the communication groove 40 and the dicing line groove 50 (see FIG. 4). Consequently, the semiconductor wafer 2 can be inhibited from being damaged due to the expansion of air that enters into the clearance 70 between the semiconductor wafer 2 and the protective tape 60.

Then, ashing is performed on the back side of the semiconductor wafer 2 to remove resist for masking that is applied on the back side of the semiconductor wafer 2 when the impurities are implanted. Although this ashing process is performed under the vacuum environment, the semiconductor wafer 2 can be inhibited from being damaged due to the expansion of air that enters into the clearance 70 between the semiconductor wafer 2 and the protective tape 60, in a similar manner as described above.

After that, a back side electrode is formed on the back side of the semiconductor wafer 2 by a well-known method. Then, the protective tape 60 is removed from the front side of the semiconductor wafer 2.

Next, a well-known dicing tape is attached to the back side of the semiconductor wafer 2. After that, the semiconductor wafer 2 is cut into dies along the dicing line grooves 50. Consequently, a plurality of semiconductor devices (RC-IGBTs) formed in the semiconductor wafer 2 can be divided into pieces, and a plurality of semiconductor devices (RC-IGBTs) can be fabricated.

The method for producing the semiconductor wafer 2 according to this embodiment and the method for producing a plurality of semiconductor devices by using the semiconductor wafer 2 have been described so far. As described above, according to the method of this embodiment, when the insulating layer 30 is formed, the communication groove 40 is formed at the same time. Thus, when the protective tape 60 is attached on the front side of the semiconductor wafer 2, even if the clearance 70 is formed between the semiconductor wafer 2 and the protective tape 60 at the step between the surface electrode 20 (signal pad 22) and the insulating layer 30, the air is hardly sealed in the clearance 70 between the semiconductor wafer 2 and the protective tape 60 because the communication groove 40 is formed on the insulating layer 30. Accordingly, when the back side of the semiconductor wafer 2 is processed after that (for example, impurity implantation or ashing), even if the semiconductor wafer is placed under the vacuum environment, the air within the clearance 70 is discharged from the perimeter of the semiconductor wafer 2 to the outside through the communication groove 40 and the dicing line groove 50. Consequently, the semiconductor wafer 2 can be inhibited from being damaged due to the expansion of air that enters between the semiconductor wafer 2 and the protective tape 60. As a result, the fabrication yield of the semiconductor device can be improved.

A correspondence relationship between this embodiment and claims will be described. The surface electrode 20 and the signal pad 22 are examples of the "surface electrode". The semiconductor wafer 2 after divided by the dicing is one example of the "semiconductor substrate". The process of forming the surface electrode 20 on the front side surface of the element region 10 and then forming the dicing line groove 50, the insulating layer 30, and the communication groove 40 at the same time by using the positive-type photosensitive polyimide is one example of "forming a surface electrode and an insulating layer". In addition, the process of forming the dicing line groove 50, the insulating layer 30, and the communication groove 40 at the same time as described above is examples of "forming a dicing line groove" and "forming a communication groove".

While techniques disclosed herein have been described in detail with reference to example embodiments thereof, it is to be understood that those examples are merely illustrative and the present invention is not limited to those examples. For example, the following modifications may be used.

(Modification 1)

In the embodiment described above, the dicing line groove 50, the insulating layer 30, and the communication groove 40 are formed by using the positive-type photosensitive polyimide. However, the present invention is not limited to this, and the dicing line groove 50, the insulating layer 30, and the communication groove 40 may be formed by using non-photosensitive polyimide. In this case, after the non-photosensitive polyimide is applied on the entire front side surface of the semiconductor wafer 2, the resist that becomes the mask is applied on the surface of the applied non-photosensitive polyimide, and then the openings are formed in the part where the surface electrode 20 is formed, the part where the signal pad 22 is formed, the part where the dicing line groove 50 is formed, and the part where the communication groove 40 is formed. After that, the polyimide in the part that is not masked by the resist is removed by means of the developer. As a result, the dicing line groove 50, the insulating layer 30, and the communication groove 40 can be formed in a similar manner as described above.

(Modification 2)

In the embodiment described above, although the dicing line groove 50, the insulating layer 30, and the communication groove 40 are formed at the same time, the dicing line groove 50, the insulating layer 30, and the communication groove 40 can be formed separately in different processes. Furthermore, the dicing line groove 50 and the communication groove 40 may be formed in any order.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A production method of a semiconductor device, comprising:
   forming, in each of a plurality of element regions disposed in a semiconductor wafer, a surface electrode and an insulating layer in a periphery of the surface electrode of which height from a front side surface of the semiconductor wafer is higher than that of the surface electrode;
   forming, in the front side surface of the semiconductor wafer, a dicing line groove that surrounds the surface electrode with the insulating layer therebetween, of which height from the front side surface of the semiconductor wafer is lower than that of the insulating layer, and that extends to a perimeter of the semiconductor wafer;
   forming, in the insulating layer, a communication groove that extends from a side of the surface electrode to a position where the dicing line groove is formed;
   attaching a protective tape to a front side of the semiconductor wafer in which the dicing line groove and the communication groove are formed; and
   processing a back side of the semiconductor wafer that is attached the protective tape.

2. The production method of a semiconductor device according to claim 1,
   wherein processing the back side of the semiconductor wafer includes implanting impurities to the back side of the semiconductor wafer.

3. The production method of a semiconductor device according to claim 1,
   wherein implanting the impurities to the back side of the semiconductor wafer includes implanting first conductivity type impurities to a part of the back side of each of the plurality of element regions in the semiconductor wafer and implanting second conductivity type impurities to other parts of the back side of each of the plurality of element regions in the semiconductor wafer.

4. The production method of a semiconductor device according to claim 1, further comprising:
   cutting the semiconductor wafer into dies along the dicing line groove after the back side of the semiconductor wafer is processed.

5. A semiconductor wafer, comprising:
   a plurality of element regions;
   a surface electrode that is disposed in each of the plurality of element regions;
   an insulating layer that is disposed in each of the plurality of element regions and of which height from a front side surface of the semiconductor wafer is higher than that of the surface electrode in a periphery of the surface electrode; and
   a dicing line groove that is formed in a front side surface of the semiconductor wafer, that surrounds the surface electrode with the insulating layer therebetween, of which height from the front side surface of the semiconductor wafer is lower than that of the insulating layer, and that extends to a perimeter of the semiconductor wafer;
   wherein the insulating layer is formed with a communication passage that extends from a side of the surface electrode to the dicing line groove.

6. A semiconductor device, comprising:
   a semiconductor substrate;
   a surface electrode that is formed on a front side surface of the semiconductor substrate, the surface electrode including a central part and a periphery; and
   an insulating layer (1) that is formed on the front side surface of the semiconductor substrate and on the periphery of the surface electrode exposing the central part of the surface electrode form the insulating layer, (2) of which height from the front side surface of the semiconductor substrate is higher than that of the surface electrode, and (3) that is formed with a communication passage extending from a surface electrode side of the insulating layer to a perimeter of the semiconductor substrate.

* * * * *